US011470712B2

(12) United States Patent
Yamazawa et al.

(10) Patent No.: US 11,470,712 B2
(45) Date of Patent: Oct. 11, 2022

(54) PLASMA PROCESSING APPARATUS

(71) Applicant: TOKYO ELECTRON LIMITED, Tokyo (JP)

(72) Inventors: Yohei Yamazawa, Miyagi (JP); Takehisa Saito, Miyagi (JP); Mayo Uda, Miyagi (JP); Keigo Toyoda, Miyagi (JP); Alok Ranjan, Austin, TX (US); Toshiki Nakajima, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 310 days.

(21) Appl. No.: 16/144,714

(22) Filed: Sep. 27, 2018

(65) Prior Publication Data
US 2019/0098740 A1 Mar. 28, 2019

(30) Foreign Application Priority Data

Sep. 28, 2017 (JP) .............................. JP2017-188480

(51) Int. Cl.
*H05H 1/46* (2006.01)
*H01J 37/32* (2006.01)
*H01L 21/67* (2006.01)

(52) U.S. Cl.
CPC ........... *H05H 1/46* (2013.01); *H01J 37/3211* (2013.01); *H01J 37/3244* (2013.01);
(Continued)

(58) Field of Classification Search
CPC ............... H05H 1/46; H05H 2001/469; H05H 2001/4667; H01L 21/67109;
(Continued)

(56) References Cited

U.S. PATENT DOCUMENTS 6,013,155 A * 1/2000 McMillin .............. C23C 16/455
118/723 I
2003/0037879 A1* 2/2003 Askarinam ....... H01L 21/67017
156/345.33
(Continued)

FOREIGN PATENT DOCUMENTS

CN 1639831 A 7/2005
CN 101877312 A 11/2010
(Continued)

OTHER PUBLICATIONS

Merriam-Webster Dictionary Definition of "surround" retrieved from https://www.merriam-webster.com/dictionary/surround on Feb. 27, 2021 (Year: 2021).*

Primary Examiner — Ram N Kackar
Assistant Examiner — Laureen Chan
(74) Attorney, Agent, or Firm — Weihrouch IP

(57) ABSTRACT

A plasma processing apparatus includes an antenna configured to generate plasma of a processing gas in a chamber. The antenna includes: an inner coil provided around the gas supply unit to surround a gas supply unit; and an outer coil provided around the gas supply unit and the inner coil to surround them. The outer coil is configured such that both ends of a wire forming the outer coil are opened; power is supplied from a power supply unit to a central point of the wire; the vicinity of the central point of the wire is grounded; and the outer coil resonates at a wavelength that is a half of a wavelength of the high frequency power. The inner coil is configured such that both ends of a wire forming the inner coil are connected through a capacitor and the inner coil is inductively coupled with the inner coil.

15 Claims, 22 Drawing Sheets

(52) U.S. Cl.
CPC .. *H01J 37/32495* (2013.01); *H01L 21/67069* (2013.01); *H05H 1/4652* (2021.05)

(58) Field of Classification Search
CPC ............ H01L 21/6831; H01L 21/67069; H01J 37/32495; H01J 37/3211; H01J 37/32119; H01J 37/32174; H01J 37/3244; H01J 37/321; H01J 37/32449; H01J 37/32651
See application file for complete search history.

(56) References Cited

U.S. PATENT DOCUMENTS

| | | | | |
|---|---|---|---|---|
| 2003/0070620 | A1* | 4/2003 | Cooperberg | C23C 16/45574 118/723 AN |
| 2010/0269980 | A1* | 10/2010 | Nishimura | H01J 37/321 156/345.48 |
| 2011/0104902 | A1* | 5/2011 | Yamazawa | H05H 1/46 438/710 |
| 2012/0241090 | A1* | 9/2012 | Yoshikawa | H01J 37/32192 156/345.41 |
| 2012/0270406 | A1* | 10/2012 | Tahara | H01J 37/32853 438/710 |
| 2013/0206338 | A1* | 8/2013 | Tanaka | C23C 16/503 156/345.33 |
| 2015/0371824 | A1* | 12/2015 | Lane | H01J 37/3211 216/67 |
| 2016/0126065 | A1* | 5/2016 | Yamawaku | H01J 37/32183 156/345.28 |
| 2016/0155630 | A1* | 6/2016 | Tsubota | H01L 21/31116 438/738 |
| 2019/0013186 | A1* | 1/2019 | Mishra | H01J 37/3211 |

FOREIGN PATENT DOCUMENTS

| | | |
|---|---|---|
| CN | 102760632 A | 10/2012 |
| CN | 103219216 A | 7/2013 |
| CN | 104994676 A | 10/2015 |
| JP | 2005-507159 A | 3/2005 |
| JP | 2010-258324 A | 11/2010 |
| WO | 03/034463 A2 | 4/2003 |

* cited by examiner

| | Ar [sccm] | | | |
|---|---|---|---|---|
| | | 100 | 500 | 1000 | 1500 |
| RF Power [W] | 100 | × | × | × | |
| | 300 | × | × | × | |
| | 500 | × | × | × | |
| | 650 | × | × | × | |

| | Ar [sccm] | | | |
|---|---|---|---|---|
| | | 100 | 500 | 1000 | 1500 |
| RF Power [W] | 100 | × | × | × | ○ |
| | 300 | × | × | × | × |
| | 500 | × | × | × | × |
| | 650 | × | × | × | × |

| | Ar [sccm] | | | |
|---|---|---|---|---|
| | | 100 | 500 | 1000 | 1500 |
| RF Power [W] | 100 | | × | ○ | ○ |
| | 300 | | × | × | × |
| | 500 | | × | × | × |
| | 650 | | × | × | × |

| | | Ar [sccm] | | | |
|---|---|---|---|---|---|
| | | 100 | 500 | 1000 | 1500 |
| RF Power [W] | 100 | ○ | ○ | ○ | |
| | 500 | ○ | ○ | ○ | |
| | 1000 | ○ | ○ | ○ | |
| | 2000 | ○ | ○ | ○ | |

| | | Ar [sccm] | | | |
|---|---|---|---|---|---|
| | | 100 | 500 | 1000 | 1500 |
| RF Power [W] | 100 | ○ | ○ | ○ | ○ |
| | 500 | ○ | ○ | ○ | ○ |
| | 1000 | ○ | ○ | ○ | ○ |
| | 2000 | ○ | ○ | ○ | ○ |

| | | Ar [sccm] | | | |
|---|---|---|---|---|---|
| | | 100 | 500 | 1000 | 1500 |
| RF Power [W] | 100 | | ○ | ○ | ○ |
| | 500 | | ○ | ○ | ○ |
| | 1000 | | ○ | ○ | ○ |
| | 2000 | | ○ | ○ | ○ |

*FIG.16*

|  | ELECTRIC FIELD REDUCTION RATE | | |
|---|---|---|---|
|  | UPPER | MIDDLE | LOWER |
| CYLINDRICAL SHIELD | 58 | 57 | 29 |
| 8 ROD-SHAPED SHIELDS | 39 | 38 | 19 |
| 12 ROD-SHAPED SHIELDS | 48 | 46 | 23 |

| RF Power [W] | Ar [sccm] | | | |
|---|---|---|---|---|
| | 100 | 500 | 1000 | 1500 |
| 100 | × | ○ | ○ | / |
| 300 | × | ○ | ○ | / |
| 500 | × | ○ | ○ | / |
| 650 | × | ○ | ○ | / |

| RF Power [W] | Ar [sccm] | | | |
|---|---|---|---|---|
| | 100 | 500 | 1000 | 1500 |
| 100 | ○ | ○ | ○ | ○ |
| 300 | × | ○ | ○ | ○ |
| 500 | × | ○ | ○ | ○ |
| 650 | × | ○ | ○ | ○ |

| RF Power [W] | Ar [sccm] | | | |
|---|---|---|---|---|
| | 100 | 500 | 1000 | 1500 |
| 100 | / | ○ | ○ | ○ |
| 300 | / | ○ | ○ | ○ |
| 500 | / | ○ | ○ | ○ |
| 650 | / | ○ | ○ | ○ |

| RF Power [W] | Ar [sccm] | | | |
|---|---|---|---|---|
| | 100 | 500 | 1000 | 1500 |
| 100 | ○ | ○ | ○ | / |
| 300 | × | ○ | ○ | / |
| 500 | × | × | ○ | / |
| 650 | × | × | × | / |

| RF Power [W] | Ar [sccm] | | | |
|---|---|---|---|---|
| | 100 | 500 | 1000 | 1500 |
| 100 | ○ | ○ | ○ | ○ |
| 300 | × | ○ | ○ | ○ |
| 500 | × | × | ○ | ○ |
| 650 | × | × | ○ | ○ |

| RF Power [W] | Ar [sccm] | | | |
|---|---|---|---|---|
| | 100 | 500 | 1000 | 1500 |
| 100 | / | ○ | ○ | ○ |
| 300 | / | ○ | ○ | ○ |
| 500 | / | ○ | ○ | ○ |
| 650 | / | × | ○ | ○ |

PLASMA PROCESSING APPARATUS

CROSS-REFERENCE TO RELATED APPLICATIONS

This application claims priority to Japanese Patent Application No. 2017-188480 filed on Sep. 28, 2017, the entire contents of which are incorporated herein by reference.

FIELD OF THE INVENTION

The present disclosure relates to a plasma processing apparatus.

BACKGROUND OF THE INVENTION

As for a processing apparatus for performing one of semiconductor manufacturing processes, there is known a plasma processing apparatus for performing etching, film formation, or the like by converting a processing gas into plasma. For example, in a single wafer processing type plasma processing apparatus, it is required to appropriately control plasma density distribution in a plane direction of a substrate depending on types of processing. Specifically, the plasma density distribution may be controlled based on a structure in the processing chamber or to deal with non-uniform processing in the substrate surface in post-processing. Therefore, instead of making the plasma density distribution uniform over the entire surface of the substrate, the plasma density distribution in a central portion of the substrate may be intentionally made to be different from that in a peripheral portion of the substrate.

As for a method of generating plasma in the plasma processing apparatus, there is known a method of exciting a processing gas by supplying a high frequency power to, e.g., an antenna, and generating an induced electric field in a processing chamber (see, e.g., Japanese Patent Application Publication No. 2010-258324). In this method, there is disclosed a configuration in which a coil-shaped inner antenna and a coil-shaped outer antenna are concentrically provided as an antenna for outputting a high frequency, and each antenna resonates at a frequency having a wavelength that is a half of that of the high frequency power. In accordance with this plasma processing apparatus, it is possible to finely control in-plane distribution of the plasma density by separately controlling the high frequency power supplied to each antenna.

Further, in an IPC (Inductively Coupled Plasma) type plasma processing apparatus, there is known a technique of supplying a processing gas supplied into a chamber from a center of a dielectric window provided with an antenna (see, e.g., Japanese Patent Application Publication No. 2005-507159).

In the technique disclosed in Japanese Patent Application Publication No. 2010-258324, the inner antenna is provided in a circular region having a radius shorter than that of the outer antenna, and thus cannot be excessively long. Further, in the technique disclosed in Japanese Patent Application Publication No. 2010-258324, each antenna is configured to resonate at a frequency having a wavelength that is a half of that of the supplied high frequency power. Therefore, depending on the size of the plasma processing apparatus, the frequency of the high frequency power supplied to the inner antenna should be higher than the frequency of the high frequency power supplied to the outer antenna. When the frequency of the high frequency supplied to the antenna is increased, the high frequency power emitted from the antenna tends to be increased.

Further, in the technique described in Japanese Patent Application Publication No. 2010-258324, it is considered to supply the processing gas into the chamber from the center of the dielectric window provided with the antenna as described in Japanese Patent Application Publication No. 2005-507159. In that case, the inner antenna is disposed near a gas line through which the processing gas is supplied. The high frequency is radiated from the inner antenna. Therefore, abnormal discharge may occur in the gas line provided at the center of the dielectric window. If abnormal discharge occurs, the inside of the gas line is damaged, and the gas line deteriorates. If the inside of the gas line is damaged, a material peeled off from the inside of the gas line by the abnormal discharge scatters as particles in the chamber and may be adhered to the target substrate.

SUMMARY OF THE INVENTION

In accordance with an aspect, there is provided a plasma processing apparatus including: a chamber configured to accommodate a target substrate; a dielectric window forming an upper portion of the chamber; a gas supply unit configured to supply a processing gas from an upper portion of the chamber into the chamber; an antenna provided above the chamber to surround the gas supply unit and configured to generate plasma of the processing gas in the chamber by supplying a high frequency power into the chamber; and a power supply unit configured to supply a high frequency power to the antenna. The antenna includes: an inner coil provided around the gas supply unit to surround the gas supply unit; and an outer coil provided around the gas supply unit and the inner coil to surround the gas supply unit and the inner coil. One of the inner coil and the outer coil is configured such that both ends of a wire forming the one coil are opened; power is supplied from the power supply unit to a central point of the wire or a vicinity of the central point of the wire; the vicinity of the central point of the wire is grounded; and the one coil resonates at a wavelength that is a half of a wavelength of the high frequency power supplied from the power supply unit, and the other one of the inner coil and the outer coil is configured such that both ends of a wire forming the other coil are connected through a capacitor and the other coil is inductively coupled with the one coil.

BRIEF DESCRIPTION OF THE DRAWINGS

The objects and features of the present disclosure will become apparent from the following description of embodiments, given in conjunction with the accompanying drawings, in which:

FIGS. 8A to 8C show examples of test results obtained by examining whether or not discharge has occurred in a comparative example;

FIGS. 9A to 9C show examples of test results obtained by examining whether or not discharge has occurred in the first embodiment;

FIG. 16 shows an example of an electric field reduction rate in the gas injection unit by the shielding members;

FIGS. 17A to 17C show examples of test results obtained by examining whether or not discharge has occurred in the second embodiment;

FIGS. 21A to 21C show an example of a test result obtained by examining whether or not discharge has occurred in the third embodiment.

DETAILED DESCRIPTION OF THE EMBODIMENTS

Figure 1:
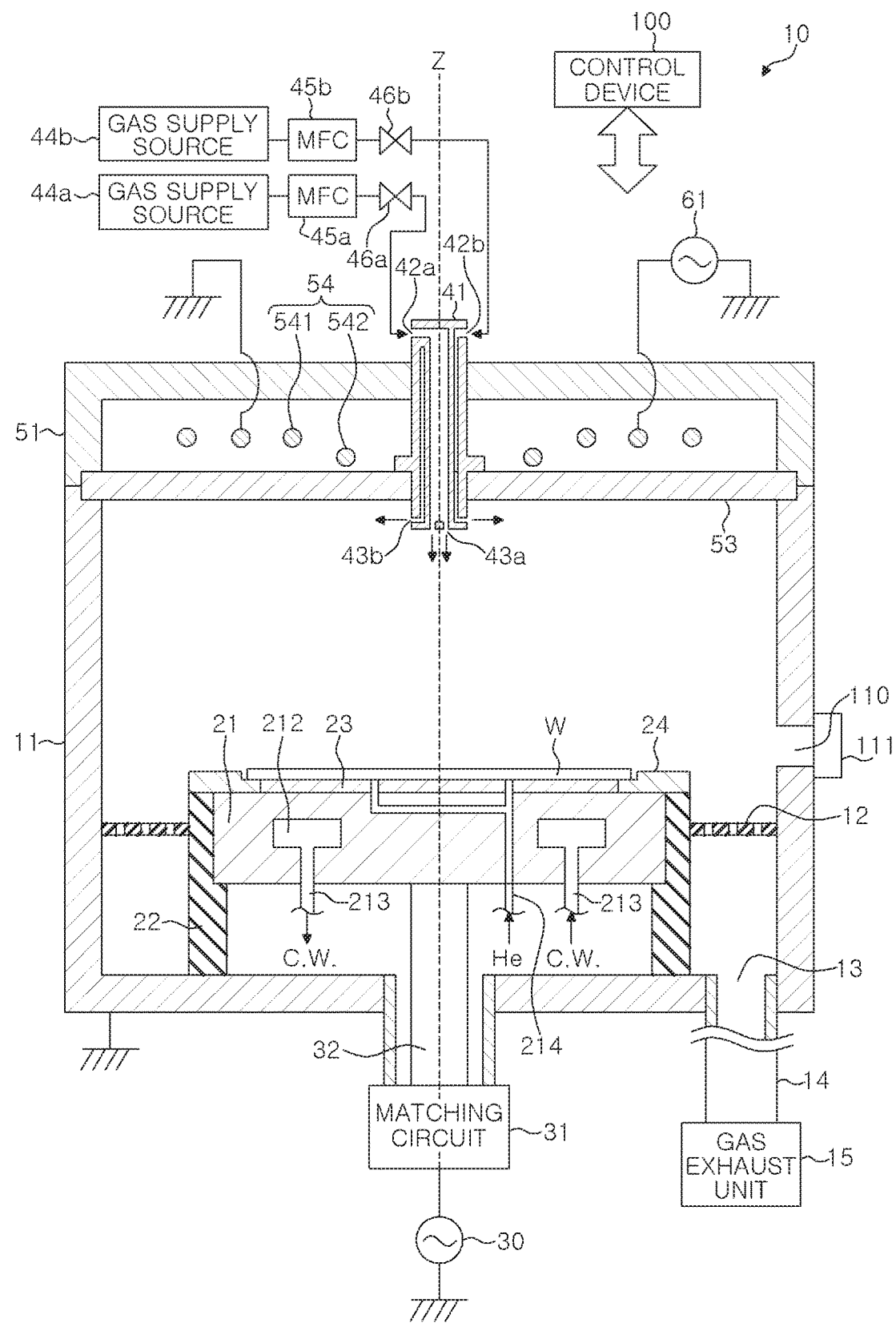
FIG. 1 is a schematic cross sectional view showing an example of a plasma processing apparatus.

In accordance with one embodiment, there is provided a plasma processing apparatus including: a chamber configured to accommodate a target substrate; a dielectric window forming an upper portion of the chamber; a gas supply unit configured to supply a processing gas from an upper portion of the chamber into the chamber; an antenna provided above the chamber to surround the gas supply unit and configured to generate plasma of the processing gas in the chamber by supplying a high frequency power into the chamber; and a power supply unit configured to supply a high frequency power to the antenna. The antenna includes: an inner coil provided around the gas supply unit to surround the gas supply unit; and an outer coil provided around the gas supply unit and the inner coil to surround the gas supply unit and the inner coil. One of the inner coil and the outer coil is configured such that both ends of a wire forming the one coil are opened; power is supplied from the power supply unit to a central point of the wire or a vicinity of the central point of the wire; the vicinity of the central point of the wire is grounded; and the one coil resonates at a wavelength that is a half of a wavelength of the high frequency power supplied from the power supply unit, and the other one of the inner coil and the outer coil is configured such that both ends of a wire forming the other coil are connected through a capacitor and the other coil is inductively coupled with the one coil.

The one coil may be wound two or more turns in a substantially circular spiral shape, the other coil may be formed in a substantially circular ring shape, and the one coil and the other coil may be arranged such that an outer shape of the one coil and an outer shape of the other coil form concentric circles.

The gas supply unit may have a substantially cylindrical shape, and the one coil and the other coil are arranged such that a center of the outer shape of the one coil and a center of the outer shape of the other coil are positioned on a central axis of the gas supply unit.

The one coil and the other coil may be arranged inside the dielectric window or above the dielectric window, and a distance between a plane including the one coil and a lower surface of the dielectric window may be different from a distance between a plane including the other coil and the lower surface of the dielectric window.

The one coil may be the outer coil, the other coil may be the inner coil, and the distance between the plane including the inner coil and the lower surface of the dielectric window may be shorter than the distance between the plane including the outer coil and the lower surface of the dielectric window.

The power supply unit may allow a frequency of the high frequency power supplied to the antenna to be variable.

The capacitor provided at the other coil may be a variable capacitance capacitor.

A flow path through which the processing gas supplied to the chamber flows may be formed in the gas supply unit, and a pressure in the flow path may be higher than a pressure in the chamber.

The gas supply unit may include: a protruding part that is a lower part of the gas supply unit and protrudes into the chamber from the lower surface of the dielectric window; a first injection port provided at the protruding part and configured to inject the processing gas in a downward direction, and a second injection port provided at the protruding part and configured to inject the processing gas in a horizontal direction or in an obliquely downward direction.

A conductive shielding member may be provided at the gas supply unit to surround a space through which the processing gas passes.

A lower end of the shielding member may be positioned below the lower surface of the dielectric window.

The shielding member may be formed in a plate shape.

The shielding member may be a metal film formed on an outer wall of the gas supply unit or a sidewall of a space in the gas supply unit through which the processing gas flows.

The shielding member may be formed in a rod shape.

At least a part of the space in the gas supply unit through which the processing gas flows may be bent to prevent formation of a linear path extending from the first injection port and the second injection port to an upper end of the gas supply unit.

In accordance with one embodiment, there is provided a plasma processing apparatus including: a chamber configured to accommodate a target substrate; a dielectric window forming an upper portion of the chamber; a gas supply unit configured to supply a processing gas into the chamber from an upper portion of the chamber; an antenna provided above the chamber to surround the gas supply unit and configured to generate plasma of the processing gas in the chamber by supplying a high frequency power into the chamber; and a power supply unit configured to supply a high frequency power to the antenna. The antenna is provided around the gas supply unit to surround the gas supply unit; both ends of a wire forming the antenna are opened; power is supplied from the power supply unit to a central point of the wire or to a vicinity of the central point of the wire; the vicinity of the central point of the wire is grounded; and the antenna is configured to resonate at a wavelength that is a half of a wavelength of the high frequency power supplied from the power supply unit, and a conductive shielding member is provided at the gas supply unit to surround a space through which the processing gas flows.

A lower end of the shielding member may be positioned below a lower surface of the dielectric window.

The shielding member may be formed in a plate shape.

The shielding member may be a metal film formed on an outer wall of the gas supply unit or a sidewall of a space in the gas supply unit through which the processing gas flows.

The shielding member may be formed in a rod shape.

The gas supply unit may include: a protruding part that is a lower part of the gas supply unit and protrudes into the chamber from the lower surface of the dielectric window; a first injection port provided at the protruding part and configured to inject the processing gas in a downward direction; and a second injection port provided at the protruding part and configured to inject the processing gas in a horizontal direction or in an obliquely downward direction, wherein at least a part of the space in the gas supply unit through which the processing gas flows is bent to prevent formation of a linear path extending from the first injection port and the second injection port to the upper end of the gas supply unit.

Hereinafter, embodiments will be described in detail with reference to the accompanying drawings. The plasma processing apparatus of the present disclosure is not limited by the following embodiments. The respective embodiments can be appropriately combined with each other within a range in which processing contents do not contradict each other.

First Embodiment (Configuration of Plasma Processing Apparatus 10)

FIG. 1 is a schematic cross sectional view showing an example of a plasma processing apparatus 10. The plasma processing apparatus 10 includes a chamber 11 made of a conductor such as aluminum or the like. An opening 110 for loading/unloading a wafer W that is an example of a target substrate is provided at a side surface of the chamber 11. The opening 110 can be opened and closed by a gate valve 111. The chamber 11 is grounded.

A disc-shaped susceptor 21 that is made of a conductive material such as aluminum or the like and configured to mount thereon a wafer W as a processing target is provided substantially at a center of a bottom surface of the chamber 11. The susceptor 21 also serves as an electrode for attracting ions in the plasma (for bias). The susceptor 21 is supported by a cylindrical susceptor support 22 made of an insulator. In the present embodiment, a central axis of the susceptor 21 supported by the susceptor support 22 is defined as the Z-axis.

A high frequency bias power supply 30 is connected to the susceptor 21 via a power feed rod 32 and a matching circuit 31. A high frequency power having a frequency of, e.g., 13 MHz, is supplied from the high frequency power supply 30 to the susceptor 21. The frequency and the power of the high frequency power supplied from the high frequency power supply 30 to the susceptor 21 are controlled by a control device 100 to be described later.

An electrostatic chuck 23 for holding the wafer W by an electrostatic attraction force is provided on an upper surface of the susceptor 21. A focus ring 24 is provided on an outer circumferential side of the electrostatic chuck 23 to surround a periphery of the wafer W. The substantially disc-shaped wafer W is mounted on the electrostatic chuck 23 such that the central axis thereof coincides with the Z-axis.

A flow path 212 through which a coolant such as cooling water (C.W.) or the like flows to control a temperature of the wafer W is formed inside the susceptor 21. The flow path 212 is connected to a chiller unit (not shown) through a line 213, and the coolant having a controlled temperature is supplied from the chiller unit to the flow path 212 through the line 213. The temperature of the coolant in the chiller unit is controlled by the control device 100 to be described later.

Inside the susceptor 21, a gas supply line 214 for supplying a heat transfer gas, e.g., He gas or the like, is provided between an upper surface of the electrostatic chuck 23 and a backside of the wafer W. The gas supply line 214 penetrates through the electrostatic chuck 23. An upper end of the gas supply line 214 is opened on the upper surface of the electrostatic chuck 23.

The susceptor 21 is provided with lifting pins that penetrate through the susceptor 21 in a vertical direction and are configured to protrude beyond and retract below the upper surface of the electrostatic chuck 23 to transfer the wafer W with respect to a transfer arm (not shown). The vertical movement of the lift pins is controlled by the control device 100 to be described later.

An annular baffle plate 12 having a plurality of through-holes is provided between an outer wall of the susceptor support 22 and an inner wall of the chamber 11. A gas exhaust port 13 is formed on the bottom surface of the chamber 11, and connected to a gas exhaust unit 15 through a gas exhaust line 14. The gas exhaust unit 15 is controlled by the control device 100 to be described later.

A disc-shaped dielectric window 53 made of a dielectric material, e.g., quartz or the like, is provided at an upper portion of the chamber 11. A space above the dielectric window 53 is covered with a cylindrical shield box 51 made of a conductor, e.g., aluminum or the like. The shield box 51 is grounded via the chamber 11. An opening is provided at the center of the shield box 51 and that of the dielectric window 53. A gas injection unit 41 for supplying a processing gas into the chamber 11 is provided at the opening. The gas injection unit 41 has a substantially cylindrical outer shape. Further, the gas injection unit 41 is provided at the central openings of the shield box 51 and the dielectric window 53 such that the central axis of the gas injection unit 41 coincides with the Z-axis. The gas injection unit 41 is an example of a gas supply unit.

Inlet ports 42a and 42b for introducing a processing gas into the gas injection unit 41 are provided at an upper portion of the gas injection unit 41. A lower portion of the gas injection unit 41 protrudes downward from a lower surface of the dielectric window 53. Formed at the lower portion of the gas injection unit 41 are injection ports 43a for injecting the processing gas in a downward direction along the Z-axis and injection ports 43b for injecting the processing gas in a horizontal direction, i.e., in a direction away from the Z-axis. The injection port 43a is an example of a first injection port. The injection port 43b is an example of a second injection port.

A gas supply source 44a is connected to the inlet port 42a via a valve 46a and an MFC (Mass Flow Controller) 45a. A gas supply source 44b is connected to the inlet port 42b via a valve 46b and an MFC 45b.

The MFC 45a controls a flow rate of the processing gas supplied from the gas supply source 44a. The valve 46a controls supply of the processing gas at a flow rate is controlled by the MFC 45a to the gas injection unit 41 and stop of the supply. The processing gas introduced into the gas injection unit 41 through the inlet port 42a is injected in a downward direction into the chamber 11 through the injection ports 43a.

The MFC 45b controls a flow rate of the processing gas supplied from the gas supply source 44b. The valve 46b controls supply of the processing gas at a flow rate controlled by the MFC 45b to the gas injection unit 41 and stop of the supply. The processing gas introduced into the gas injection unit 41 through the inlet port 42b is injected into the chamber 11 through the injection ports 43b in a horizontal direction. The MFCs 45a and 45b, and the valves 46a and 46b are independently controlled by the control device 100 to be described later.

In the present embodiment, an etching gas, e.g., $CF_4$ gas, chlorine gas, or the like, is supplied as the processing gas from the gas supply sources 44a and 44b into the chamber 11. Different processing gases may be supplied from the gas supply sources 44a and 44b into the chamber 11, respectively.

An antenna 54 for plasma generation is accommodated in a space that is surrounded by the dielectric window 53 and the shield box 51 at a position above the chamber 11. The antenna 54 includes an outer coil 541 and an inner coil 542. The inner coil 542 is provided around the gas injection unit 41 to surround the gas injection unit 41. The outer coil 541 is provided around the gas injection unit 41 and the inner coil 542 to surround the gas injection unit 41 and the inner coil 542. The outer coil 541 and the inner coil 542 are supported by a support mechanism (not shown) to be positioned above the dielectric window 53 while being separated from the dielectric window 53. Further, the outer coil 541 and the inner coil 542 are not necessarily separated from the dielectric window 53. One or both of the outer coil 541 and the inner coil 542 may be in contact with an upper surface of the dielectric window 53. Further, one or both of the outer coil 541 and the inner coil 542 may be formed inside the dielectric window 53.

(Structure of the Antenna 54)

Figure 2:
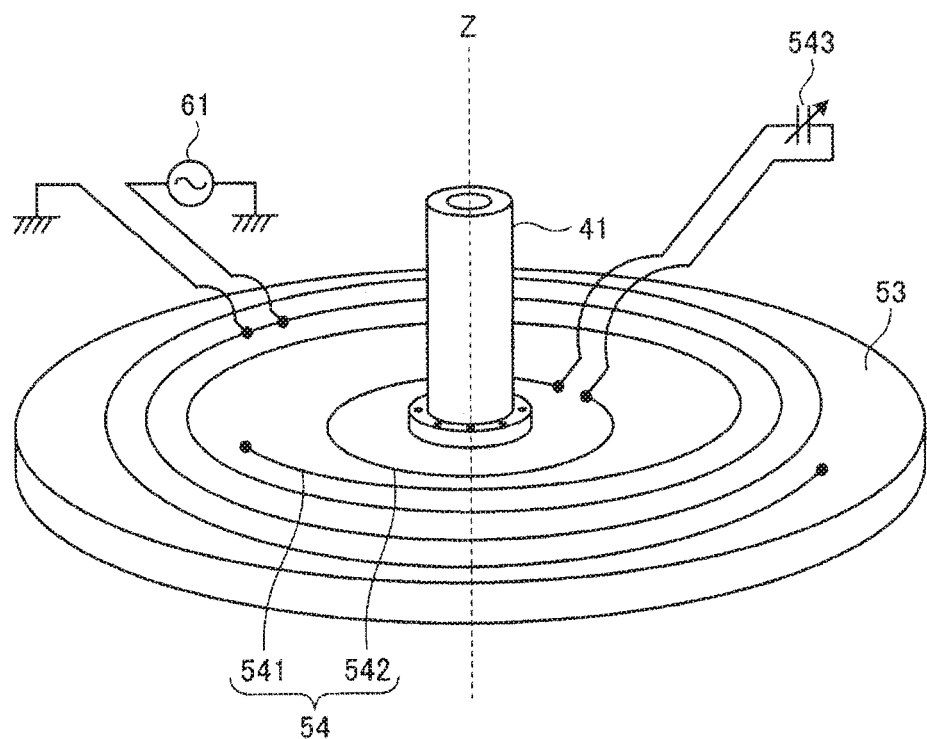
FIG. 2 is a schematic perspective view showing an example of an antenna.

FIG. 2 is a schematic perspective view showing an example of the antenna 54. As shown in FIG. 2, for example, the outer coil 541 is wound two or more turns in a substantially circular spiral shape. The outer coil 541 is provided above the dielectric window 53 such that the central axis of the outer shape of the outer coil 541 coincides with the Z-axis. As shown in FIG. 2, for example, the inner coil 542 is formed in a substantially circular ring shape and is provided above the dielectric window 53 such that the center axis of the inner coil 542 coincides with the Z-axis.

In the present embodiment, the outer coil 541 and the inner coil 542 are planar coils and arranged above the lower surface of the dielectric window 53 to be substantially in parallel to the surface of the wafer W mounted on the electrostatic chuck 23, the lower surface being a boundary surface with respect to a plasma generation space. Further, in the present embodiment, a distance between the outer coil 541 and the lower surface of the dielectric window 53 is different from a distance between the inner coil 542 and the lower surface of the dielectric window 53. For example, the distance between the inner coil 542 and the lower surface of the dielectric window 53 is shorter than the distance between the outer coil 541 and the lower surface of the dielectric window 53. In another example, the distance between the outer coil 541 and the upper surface of the dielectric window 53 and the distance between the inner coil 542 and the upper surface of the dielectric window 53 may be the same. The distance between the outer coil 541 and the upper surface of the dielectric window 53 may be longer than the distance between the inner coil 542 and the upper surface of the dielectric window 53. The distance between the outer coil 541 and the lower surface of the dielectric window 53 and the distance between the inner coil 542 and the lower surface of the dielectric window 53 may be independently changed by a driving unit (not shown).

Figure 3:
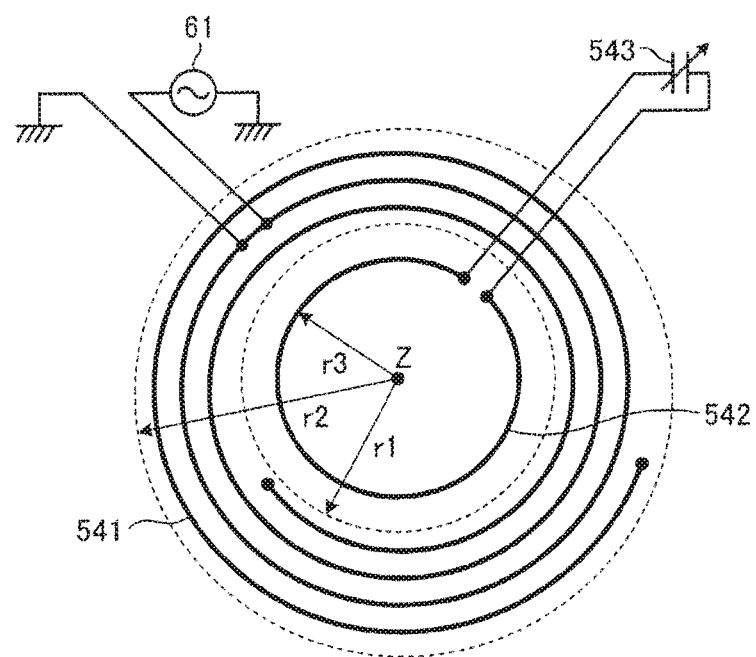
FIG. 3 shows an example of arrangement of an inner coil and an outer coil.

FIG. 3 shows an example of arrangement of the inner coil 542 and the outer coil 541. FIG. 3 shows an example of the arrangement of the inner coil 542 and the outer coil 541 when viewed from the Z-axis direction. The inner coil 542 has a circular shape with a radius r3 and is arranged such that the center of the circle coincides with the Z-axis. In the present embodiment, the radius r3 is, e.g., 75 mm or less.

The outer coil 541 has a substantially circular spiral shape in a region between a circle having a radius r1 and a circle having a radius r2. The outer coil 541 is provided such that the center of the circle having the radius r1 and the center of the circle having the radius r2 coincide with the Z-axis. In other words, the outer coil 541 and the inner coil 542 are arranged such that the outer shape of the outer coil 541 and the outer shape of the inner coil 542 form concentric circles. In the present embodiment, the radius r1 is, e.g., 140 mm, and the radius r2 is, e.g., 210 mm.

Both ends of a wire forming the outer coil 541 are opened. The high frequency power supply 61 is connected to a central point of the wire forming the outer coil 541 or to a vicinity of the central point, and the high frequency power is supplied from the high frequency power supply 61 to the outer coil 541. The high frequency power supply 61 is an example of a power supply unit. Further, the vicinity of the central point of the wire forming the outer coil 541 is grounded. The outer coil 541 is configured to resonate at a wavelength that is a half of a wavelength λ of the high frequency power supplied from the high frequency power supply 61. In other words, the outer coil 541 functions as a planar helical resonator. A voltage generated in the wire forming the outer coil 541 is distributed such that it becomes minimum near the central point of the wire and becomes maximum at both ends of the wire. In addition, a current generated in the wire forming the outer coil 541 is distributed such that it becomes maximum near the central point of the wire and becomes minimum at both ends of the wire. The frequency and the power of the high frequency power supplied from the high frequency power supply 61 to the outer coil 541 can be changed. The frequency and the power of the high frequency power supplied from the high frequency power supply 61 to the outer coil 541 are controlled by the control device 100 to be described later.

Both ends of a wire forming the inner coil 542 are connected to each other through a capacitor 543. In the present embodiment, the capacitor 543 is a variable capacitor. The capacitor 543 may be a capacitor having a fixed capacitance. The inner coil 542 is inductively coupled with the outer coil 541. The current flows through the inner coil 542 in a direction to cancel a magnetic field generated by the current flowing through the outer coil 541. It is possible to control the direction or the magnitude of the current flowing through the inner coil 542 with respect to the current flowing through the outer coil 541 by controlling the capacitance of the capacitor 543. The capacitance of the capacitor 543 is controlled by the control device 100 to be described later.

A magnetic field is generated in the Z-axis direction by the current flowing through the outer coil 541 and the current flowing through the inner coil 542, and an induced electric field is generated in the chamber 11 by the generated magnetic field. Due to the induced electric field generated in the chamber 11, the processing gas supplied into the chamber 11 from the gas injection unit 41 is converted into plasma. Predetermined processing such as etching or the like is performed on the wafer W on the electrostatic chuck 23 by ions and active species contained in the plasma.

Here, it is considered to provide a planar type helical resonator having a similar size to that of the inner coil 542, instead of the inner coil 542, inside the outer coil 541 (the gas injection unit 41 side). Since the inner region of the outer coil 541 is smaller than the region where the outer coil 541 is disposed, it is difficult to provide a line having the same length as that of the wire forming the outer coil 541 in the inner region of the outer coil 541. Therefore, the wire forming the planar helical resonator (hereinafter, referred to as "inner resonator") disposed in the inner region of the outer coil 541 should be shorter than the wire forming the outer coil 541. If the wire becomes shorter, the resonance frequency is increased. Therefore, the resonance frequency of the inner resonator should be higher than that of the outer coil 541. When the frequency becomes higher, the energy of the electromagnetic wave radiated from the coil becomes higher.

The gas injection unit 41 is arranged in the inner resonator. The inner resonator and the gas injection unit are close to each other. Therefore, electromagnetic waves radiated from the inner resonator enter the space in the gas injection unit 41 where the processing gas flows. When the resonance frequency of the inner resonator becomes higher, the energy of the electromagnetic waves radiated from the inner resonator becomes higher. Therefore, electromagnetic waves of higher energy enter the space in the gas injection unit 41 where the processing gas flows. Accordingly, abnormal discharge may occur in the space in the gas injection unit 41 where the processing gas flows.

The energy of the electromagnetic waves entering the space in the gas injection unit 41 from the inner resonator may be suppressed by separating the inner resonator from the gas injection unit 41. However, when the inner resonator is separated from the Z-axis, it is difficult to independently control the plasma in the region near the Z-axis and the plasma in the region far from the Z-axis. Therefore, the inner resonator contributing to the control of the plasma near the Z-axis needs to be located near the gas injection unit 41. Accordingly, in the case of using the inner resonator, it is difficult to avoid abnormal discharge occurring in the space in the gas injection unit 41 where the processing gas flows.

On the other hand, in the present embodiment, a loop-shaped inner coil 542 having both ends connected by a capacitor 543 is provided, instead of the planar helical resonator, inside the outer coil 541 (the gas injection unit 41 side). The inner coil 542 generates an induced current in response to the magnetic field generated by the current flowing through the outer coil 541 without resonating by the directly supplied high frequency power. Therefore, the current having the same frequency as that of the current flowing through the outer coil 541 flows through the inner coil 542 regardless of the length of the wire forming the inner coil 542. Accordingly, even when the length of the wire forming the inner coil 542 is shorter than that of the wire forming the outer coil 541, the current having the same frequency as that of the current flowing through the outer coil 541 can be generated in the inner coil 42.

Since the region where the outer coil 541 is disposed is greater than the inner region of the outer coil 541, a relatively long line can be used as the wire forming the outer coil 541 and, thus, the outer coil 541 functioning as a planar type helical resonator can resonate at a relatively low frequency. Therefore, a current having a relatively low frequency that is the same as the frequency of the current flowing through the outer coil 541 is generated in the inner coil 542. Accordingly, the energy of electromagnetic waves radiated from the inner coil 542 is suppressed, and the energy of electromagnetic waves entering the gas injection unit 41 is suppressed. As a result, it is possible to suppress occurrence of abnormal discharge in the space in the gas injection unit 41.

Referring back to FIG. 1, the explanation will be continued. The plasma processing apparatus 10 includes the control device 100 for controlling the respective components of the plasma processing apparatus 10. The control device 100 includes a memory such as a ROM (Read Only Memory), a RAM (Random Access Memory), or the like, and a processor such as a CPU (Central Processing Unit) or the like. Data such as recipes and the like, programs, and the like are stored in the memory in the control device 100. The processor in the control device 100 reads out and executes the program stored in the memory inside the control device 100 and controls the respective components of the plasma processing apparatus 10 based on the data such as the recipes and the like stored in the memory in the control device 100.

(Current Flowing Through the Outer Coil 541 and Current Flowing Through the Inner Coil 542)

Figure 4:
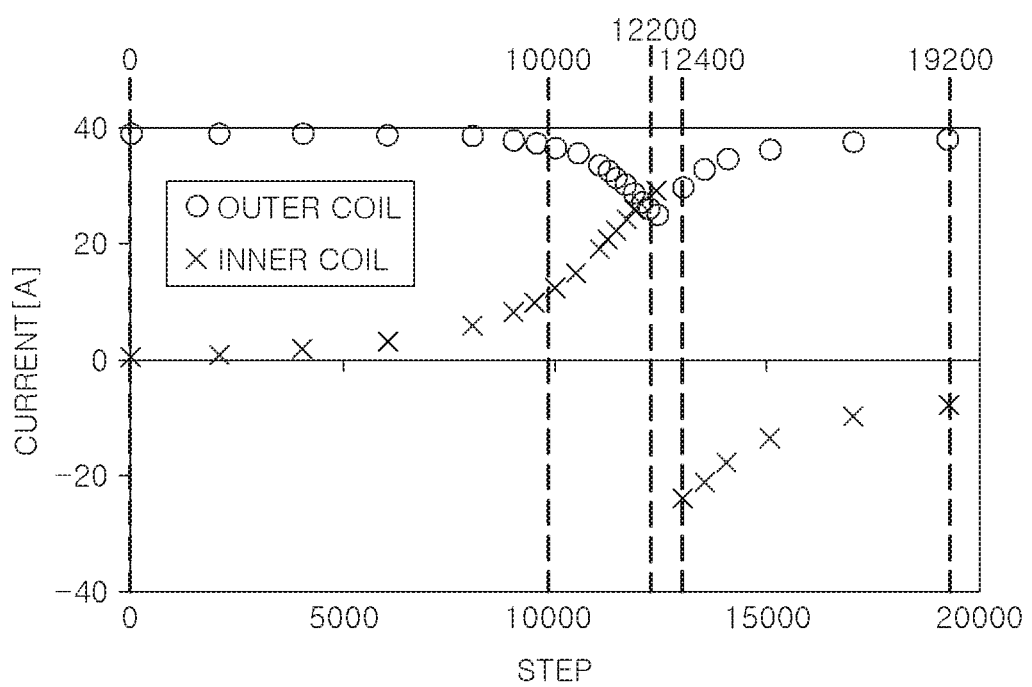
FIG. 4 shows an example of changes in a current flowing through the inner coil and a current flowing through the outer coil in the case of varying a capacitance of a capacitor of the inner coil.

FIG. 4 shows an example of changes in the current flowing through the inner coil 542 and the current flowing through the outer coil 541 in the case of varying the capacitance of the capacitor 543 of the inner coil 542. FIG. 4 shows the changes in the current flowing through the inner coil 542 and the current flowing through the outer coil 541 in the case of varying the range of the capacitance of the capacitor 543 from 10 pF to 100 pF in 0 to 19200 steps by a stepping motor.

The test result shown in FIG. 4 was obtained mainly under the following conditions.

Pressure in the chamber 11: 100 mT

Processing gas: $Ar/CF_4$=70/10 sccm

High frequency power supplied to the outer coil 541: 1000 W

Frequency of the high frequency power supplied to the outer coil 541: 27 MHz As shown in FIG. 4, for example, as the capacitance of the capacitor 543 is increased from 10 pF (capacitance corresponding to 0 step), the energy supplied from the outer coil 541 to the inner coil 542 by electromagnetic induction is increased and, thus, the current flowing through the inner coil 542 is increased. On the other hand, as the energy supplied to the inner coil 542 is increased, the energy of the outer coil 541 is decreased and, thus, the current flowing through the outer coil 541 is decreased. When the capacitance of the capacitor 543 becomes close to the capacitance corresponding to 12200 steps, the current flowing through the inner coil 542 becomes maximum and the current flowing through the outer coil 541 becomes substantially the same as that flowing through the inner coil 542.

Figure 5A:
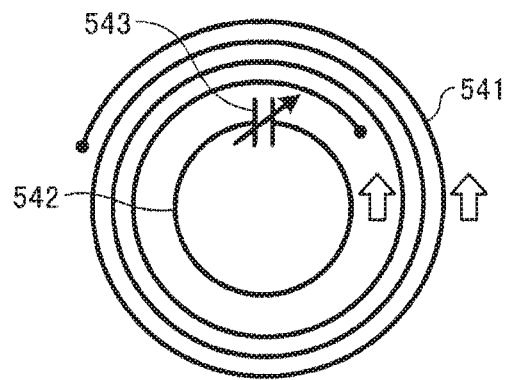
FIGS. 5A and 5B show examples of a direction of the current flowing through the inner coil and a direction of the current flowing through the outer coil.
Figure 5B:
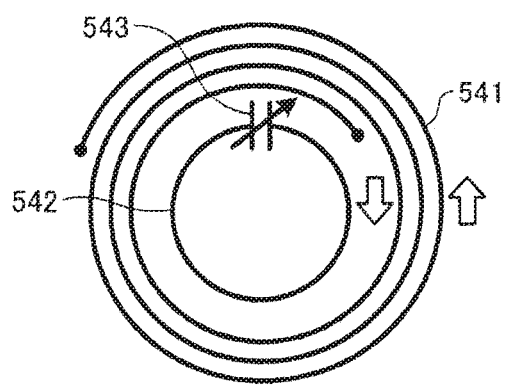

When the capacitance of the capacitor 543 is further increased from the capacitance corresponding to 12200 steps to the capacitance corresponding to 12400 steps, the polarity of the current flowing through the inner coil 542 is inverted and a large current flows in the opposite direction. This is because the direction of the current flowing through the outer coil 541 and the direction of the current flowing through the inner coil 542 are the same (in-phase) at the capacitance from 0 step to 12400 steps as can be seen from FIG. 5A, and the direction of the current flowing through the outer coil 541 and the direction of the current flowing through the inner coil 542 are opposite (reversed-phase) at the capacitance from 12400 steps to 19200 steps as can be seen from FIG. 5B, for example.

Figure 6:
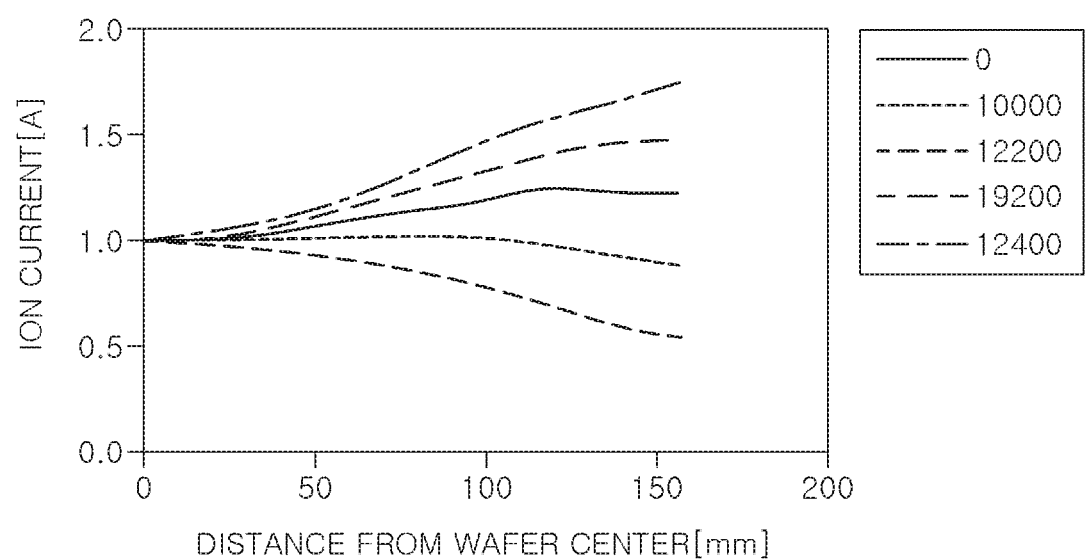
FIG. 6 shows an example of ion current distribution on a wafer.

FIG. 6 shows an example of ion current distribution on the wafer W. The ion current was measured in a radial direction from the central portion of the wafer W toward the outer peripheral portion of the wafer W by using a planar Langmuir probe. FIG. 6 shows the distribution of the ion current with respect to the capacitance of the capacitor 543 corresponding to each step in a state where the ion current at the central portion of the wafer W is normalized to 1. The magnitude of the ion current on the wafer W is correlated with the density of the plasma on the wafer W. Therefore, the ion current distribution on the wafer W corresponds to the plasma density distribution on the wafer W.

Referring to FIG. 6, in the case of the capacitance of the capacitor 543 which corresponds to the 0 step, the ion current is slightly increased at a position slightly outer than the center of the wafer W. As the capacitance of the capacitor 543 is increased, the ion current near the center of the wafer W becomes relatively greater. This is because the direction of the current flowing through the outer coil 541 and that of the current flowing through the inner coil 542 are the same (same phase) as can be seen from FIG. 5A, for example, and the ion current near the center of the wafer W is increased due to the strong induced electric field generated by the magnetic field generated by both coils.

On the other hand, in the case of the capacitance of the capacitor 543 which corresponds to the 12400 steps, the ion current is relatively small near the center of the wafer W. This is because the direction of the current flowing through the outer coil 541 and that of the current flowing through the inner coil 542 are opposite (anti-phase), as can be seen from FIG. 5B, for example, and the ion current near the center of the wafer W is decreased due to the weak induced electric field generated by the magnetic field generated by both coils.

By controlling the capacitance of the capacitor 543 connected to the inner coil 542, the plasma density distribution in the radial direction about the Z-axis on the wafer W can be controlled. Accordingly, the accuracy of the processing on the wafer W can be improved.

(Structure of the Gas Injection Unit 41)

Figure 7:
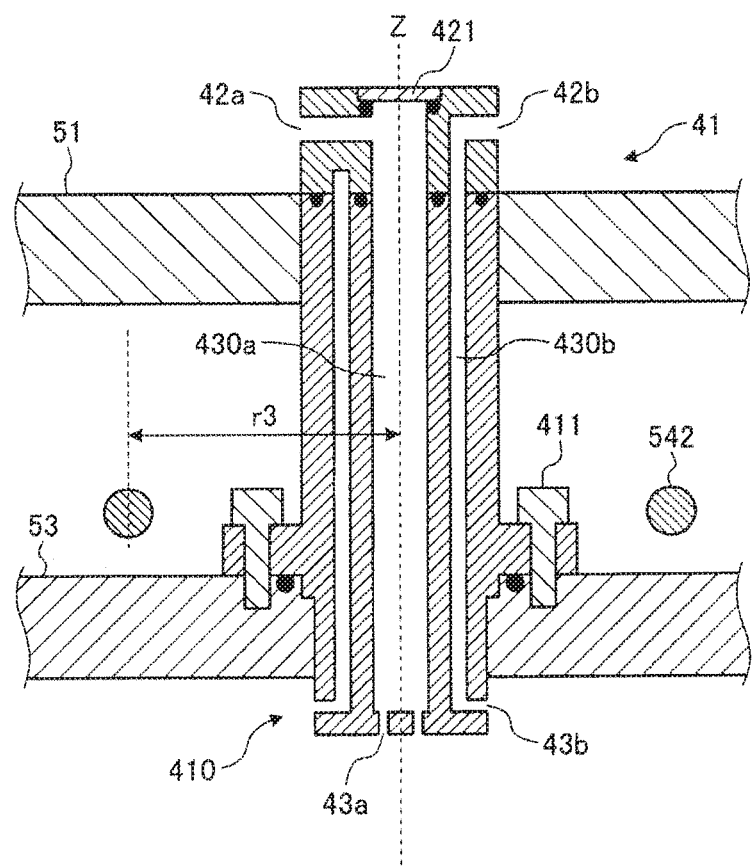
FIG. 7 is a cross sectional view showing an example of a structure of a gas injecting unit in a first embodiment.

FIG. 7 is a cross sectional view showing an example of the structure of the gas injection unit 41 in the first embodiment. The gas injection unit 41 is made of a dielectric material, e.g., ceramic, quartz, or the like, and has a substantially cylindrical outer shape. The gas injection unit 41 is fitted to the opening formed at the center of the shield box 51 and the opening formed at the center of the dielectric window 53 and fixed to the dielectric window 53 by screws 411. The gas injection unit is fixed to the dielectric window 53 such that the central axis thereof coincides with the Z-axis. A lower part 410 of the gas injection unit 41 protrudes more downward than the lower surface of the dielectric window 53. The lower part 410 of the gas injection unit 41 is an example of a protruding part.

A plurality of injection ports 43a and a plurality of injection ports 43b are formed at the lower part 410 of the gas injection unit 41. The injection ports 43a are formed on the circumference about the Z-axis which corresponds to the lower surface of the gas injection unit 41 and inject the processing gas in a downward direction. The injection ports 43b are formed at the sidewall of the lower part 410 of the gas injection unit 41 and inject the processing gas in the horizontal direction.

The processing gas supplied through the inlet port 42a passes through a substantially cylindrical space 430a having the Z-axis as the central axis thereof and is injected in a downward direction through the injection ports 43a. The processing gas supplied through the inlet port 42b passes through a space 430b provided around the space 430a and is injected through the injection ports 43b radially about the Z-axis. The space 430a and the space 430b are examples of flow paths through which the processing gas supplied to the chamber 11 flows.

A transparent window 421 made of quartz or the like is provided on the upper portion of the gas injection unit 41. The window 421 allows whether or not discharge has occurred in the space 430a to be detected. The window 421 also allows the intensity, the wavelength, or the like of the light emitted from the plasma in the chamber 11 through the space 430a and the injection ports 43a to be observed.

(Test Result)

Next, a test was conducted to examine whether or not abnormal discharge has occurred in the gas injection unit 41 in the case of generating plasma in the chamber 11. FIGS. 8A to 8C show examples of the test results obtained by examining whether or not discharge has occurred in the comparative example. FIG. 8A shows the test result obtained when the pressure in the chamber 11 is 10 mT. FIG. 8B shows the test result obtained when the pressure in the chamber 11 is 100 mT. FIG. 8C shows the test result obtained when the pressure in the chamber 11 is 400 mT. In the comparative example, the test was conducted by providing an inner resonator instead of the inner coil 542. In the test, the high frequency power was not applied to the outer coil 541.

The main conditions of the test in the comparative example are as follows.

Pressure in the chamber 11: 10 to 400 mT

Processing gas: Ar=100 to 1500 sccm

High frequency power supplied to the inner resonator: 100 to 650 W

Frequency of the high frequency power supplied to the inner resonator: 60 MHz

In FIGS. 8A to 8C, the condition in which the abnormal discharge has not occurred is expressed by ○, and the condition in which the abnormal discharge has occurred is expressed by x. As shown in FIGS. 8A to 8C, in the comparative example in which the inner resonator is used instead of the inner coil 542, abnormal discharge has occurred in the gas injection unit 41 under substantially all conditions. The pressure in the spaces 430a and 430b of the gas injection unit 41 was considerably higher than that in the chamber 11. The pressure in the spaces 430a and 430b was within a range from 3 Torr and 25 Torr.

FIGS. 9A to 9C show examples of test results obtained by examining whether or not discharge has occurred in the first embodiment. FIG. 9A shows the test result obtained when the pressure in the chamber 11 is 10 mT. FIG. 9B shows the test result obtained when the pressure in the chamber 11 is 100 mT. FIG. 9C shows the test result obtained when the pressure in the chamber 11 is 400 mT.

The test results shown in FIGS. 9A to 9C were obtained mainly under the following conditions.

Pressure in the chamber 11: 10 to 400 mT
Processing gas: Ar=100 to 1500 sccm
High frequency power supplied to the outer coil 541: 100 to 2000 W
Frequency of the high frequency power supplied to the outer coil 541: 27 MHz The test was conducted while setting the capacitance of the capacitor 543 connected to the inner coil 542 to the capacitance corresponding to 12200 steps shown in FIG. 4. As shown in FIG. 9, for example, in the first embodiment, abnormal discharge has not occurred in the gas injection unit 41 under all conditions. The occurrence of abnormal discharge in the gas injection unit 41 can be suppressed by providing the inner coil 542 inside the outer coil 541. Further, the plasma density distribution on the wafer W can be controlled by controlling the capacitance of the capacitor 543 of the inner coil 542 as shown in FIG. 6.

(Simulation of the Flow of Gas Injected from the Gas Injection Unit 41)

Figure 10A:
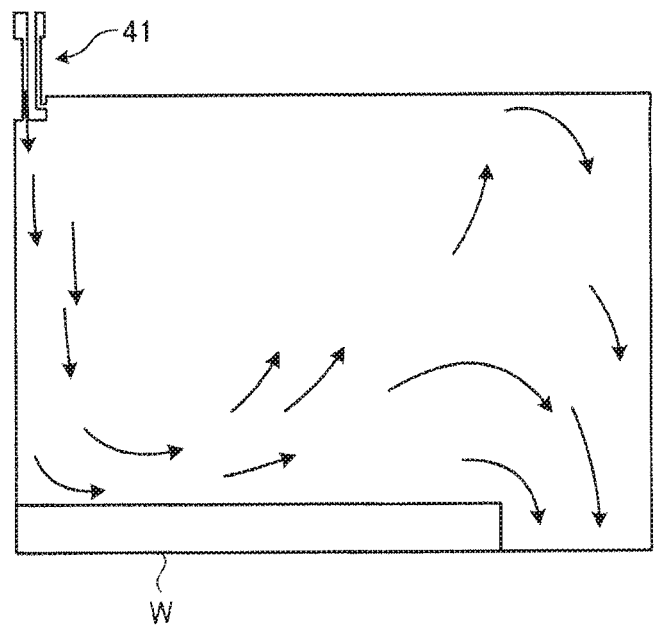
FIGS. 10A and 10B show examples of simulation results of flow of gas injected from the gas injection unit.
Figure 10B:
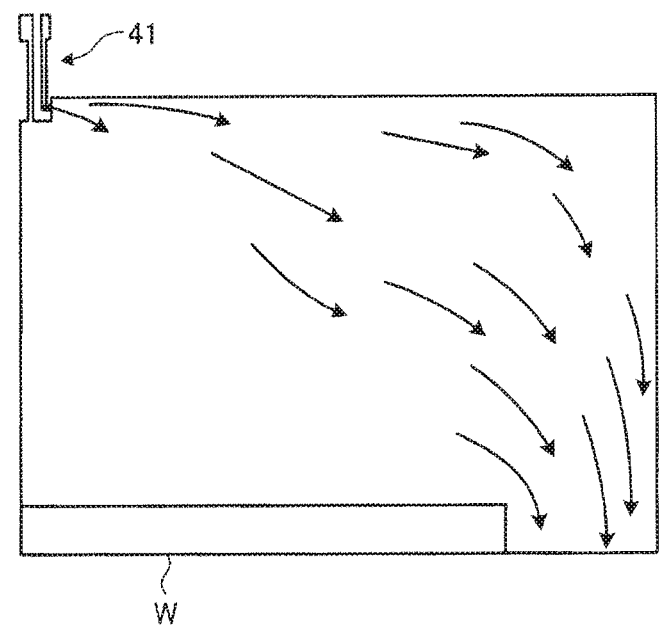

In the present embodiment, as shown in FIG. 7, for example, the lower part 410 of the gas injection unit 41 is provided with the injection ports 43a for injecting gas in a downward direction and the injection ports 43b for injecting gas in a horizontal direction. FIGS. 10A and 10B show examples of the simulation results of the flow of the gas injected from the gas injection unit 41. FIG. 10A shows the simulation result of the flow of the gas injected in a downward direction from the injection ports 43a. FIG. 10B shows the simulation result of the flow of the gas injected in a horizontal direction from the injection ports 43b.

The main conditions of the simulation are as follows.
Pressure in chamber 11: 50 mT
Processing gas: Ar=500 sccm
Reaction by-product: $SiCl_4$=50 sccm (entire surface of the wafer W)

The reaction by-product is a substance generated as a result of the reaction between the wafer W and particles generated from the plasma of the etching gas at the time of etching the wafer W. In the simulation, it is assumed that the reaction by-product is $SiCl_4$ that is a compound of silicon contained in the wafer W and halogen contained in the etching gas and it is uniformly supplied into the chamber 11 from the entire surface of the wafer W.

When the gas is injected in a downward direction, strong gas flow directed from the center of the wafer W toward the edge of the wafer is generated near the center of the wafer W as can be seen from FIG. 10A, for example. Accordingly, the generated reaction by-product is efficiently removed near the center of the wafer W. Since, however, the gas flow is weak near the edge of the wafer W, the effect of removing the reaction by-product is low near the edge of the wafer W.

On the other hand, when gas is injected in a horizontal direction, strong gas flow is generated near the edge of the wafer W, whereas the gas flow near the center of the wafer W is weak, as can be seen from FIG. 10B, for example. Therefore, the generated reaction by-product is efficiently removed near the edge of the wafer W. However, the effect of removing the reaction by-product is low near the center of the wafer W.

Figure 11A:
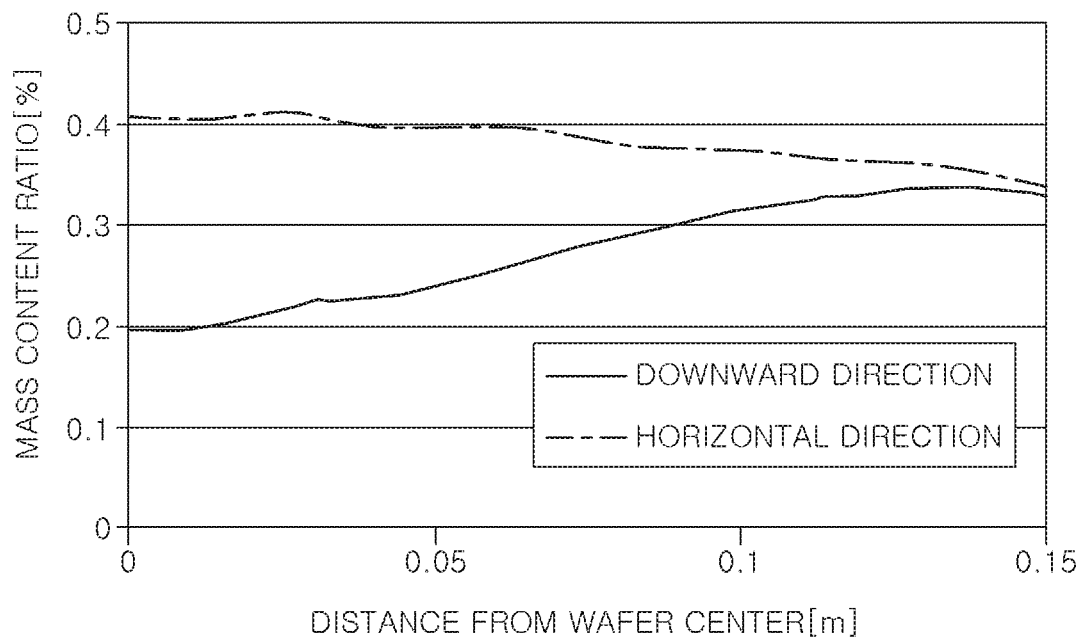
FIGS. 11A and 11B show examples of mass content distribution of reaction by-products on the wafer.
Figure 11B:
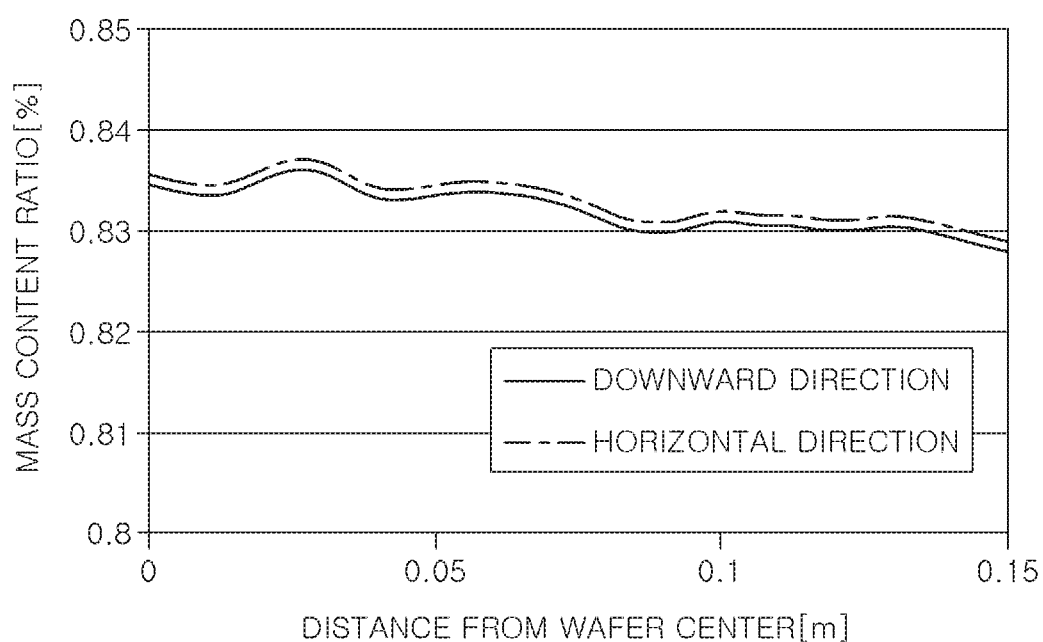

FIGS. 11A and 11B show examples of the mass content distribution of the reaction by-product on the wafer W. FIG. 11A shows the mass content distribution of the reaction by-product on the wafer W in the case of setting the flow rate of Ar gas to 500 sccm. FIG. 11B shows the mass content distribution of the reaction by-product on the wafer W in the case of setting the flow rate of Ar gas to 45 sccm.

As clearly can be seen from FIG. 11A, for example, when the gas is injected in a downward direction from the injection ports 43a, the content ratio of the reaction by-product is lower near the center of the wafer W than near the edge of the wafer W, and the reaction by-product is removed more efficiently near the center of the wafer W than near the edge of the wafer W. On the other hand, when the gas is injected in a horizontal direction from the injection ports 43b, the content ratio of the reaction by-product is slightly lower near the edge of the wafer W than near the center of the wafer W, and the reaction by-product is removed more efficiently near the edge of the wafer W than near the center of the wafer W.

The result of FIG. 11A shows that strong gas flow can be generated near both of the center and the edge of the wafer W by combining the downward gas injection from the injection ports 43a and the horizontal gas injection from the injection ports 43b. Accordingly, the reaction by-product generated on the wafer W can be efficiently removed. When the flow rate of the injected gas is small, the content ratio of the reaction by-product is increased and the reaction by-product removal effect is decreased regardless of the gas injection direction, as can be seen from FIG. 11B, for example. Therefore, it is required to increase the flow rate of the gas injected from the injection ports 43a and 43b.

(Influence on the Processing by the Flow of Gas Injected from the Gas Injection Unit 41)

Figure 12A:
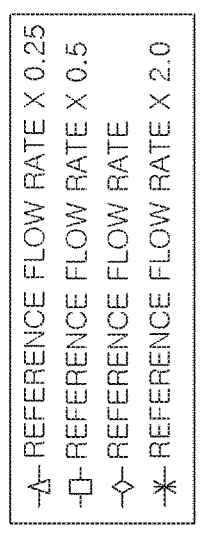
FIGS. 12A to 12C show examples of changes in deposition rate distribution of a reaction by-product with respect to a gas flow rate in the case of generating plasma of an etching gas and etching the wafer in a chamber.
Figure 12B:
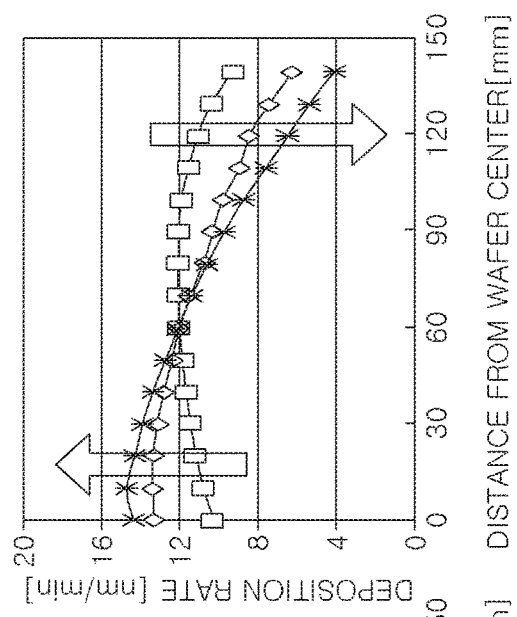
Figure 12C:
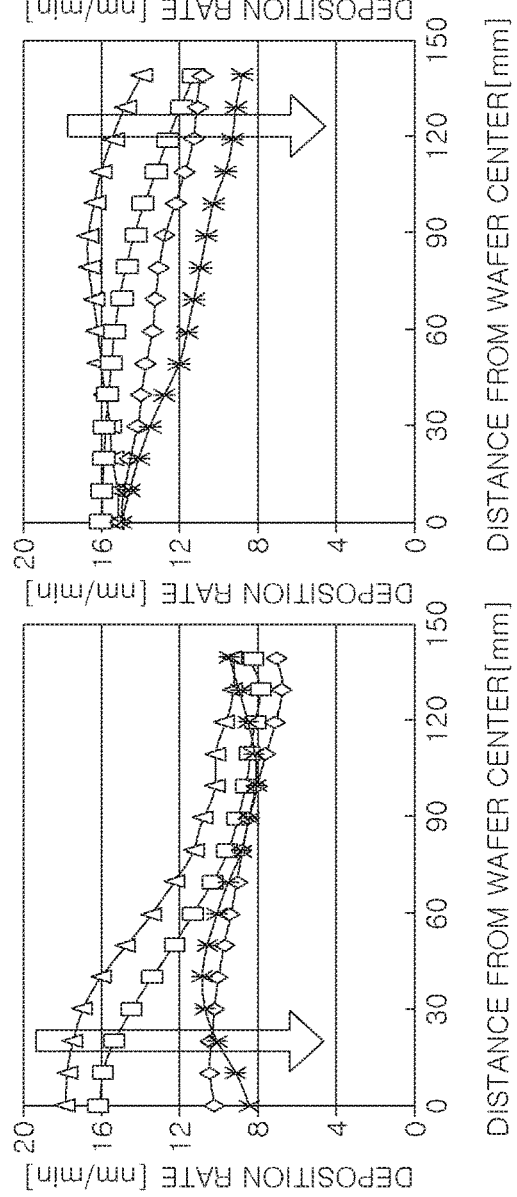

FIGS. 12A to 12C show examples of changes in deposition rate distribution of the reaction by-product with respect to the gas flow rate in the case of generating plasma of the etching gas and etching the wafer W in the chamber 11. At this time, the wafer W is made of silicon; $Cl_2$, HBr, Ar and $O_2$ are used as the etching gas; and the reaction by-product is SiOClBr. The reaction by-product is discharged from the surface of the wafer W into the chamber 11 by etching. However, a part of the reaction by-product is re-adhered to the wafer W. Therefore, the amount of the reaction by-product re-adhered to the wafer W is measured as a deposition rate. FIG. 12A shows the deposition ratio distribution of the reaction by-product in the case of injecting the gas in a downward direction. FIG. 12B shows the deposition ratio distribution of the reaction by-product in the case of injecting the gas in a horizontal direction. In FIG. 12C, the deposition rate distribution of the reaction by-product in the case of injecting the gas from the sidewall of the chamber 11 toward the Z-axis is shown as a comparative example. The flow rates shown in FIGS. 12A to 12C indicate the flow rates of the etching gas. A reference flow rate is 500 sccm.

When the flow rate of the gas injected in a downward direction is increased, the deposition ratio of the reaction by-product near the center of the wafer W is considerably decreased, whereas the deposition ratio of the reaction by-product near the edge of the wafer W is hardly changed, as can be seen from FIG. 12A, for example. On the other hand, when the flow rate of the gas injected in a horizontal direction is increased, the deposition rate of the reaction by-product near the edge of the wafer W is considerably decreased, whereas the deposition ratio of the reaction by-product near the center of the wafer W is hardly changed, as can be seen from FIG. 12B, for example.

Since the deposition rate of reaction by-product is proportional to the remaining amount of reaction by-product therearound, it is considered that the reaction by-product can be removed efficiently near both of the center and the edge of the wafer W by combining the downward gas injection from the injection ports 43*a* and the horizontal gas injection from the injection ports 43*b*, as can be seen from the results of FIGS. 12A and 12B.

When the gas is injected from the sidewall of the chamber 11 toward the Z-axis, as the flow rate of the injected gas is decreased, the deposition rate is higher at a position between the vicinity of the center of the wafer W and the vicinity of the edge of the wafer W. As the flow rate of the injected gas is increased, the deposition rate in the vicinity of the edge of the wafer W is decreased and the deposition rate in the vicinity of the center of the wafer W is increased, as can be seen from FIG. 12C, for example. This is because the gas is injected from the sidewall of the chamber 11 and, thus, the reaction by-product in the vicinity of the edge of the wafer W is pushed toward the vicinity of the center of the wafer W as the flow rate of the gas is increased. Accordingly, when the gas is injected from the sidewall of the chamber 11 toward the Z-axis, it is difficult to efficiently remove the reaction by-product on the wafer W.

The first embodiment has been described above. As apparent from the above description, in accordance with the plasma processing apparatus 10 of the present embodiment, it is possible to finely control the plasma density distribution while suppressing occurrence of abnormal discharge. Further, in the present embodiment, the processing gas is injected in a downward direction and in a horizontal direction from the gas injection unit 41 and, thus, the reaction by-product generated on the wafer W can be removed efficiently.

Figure 13:
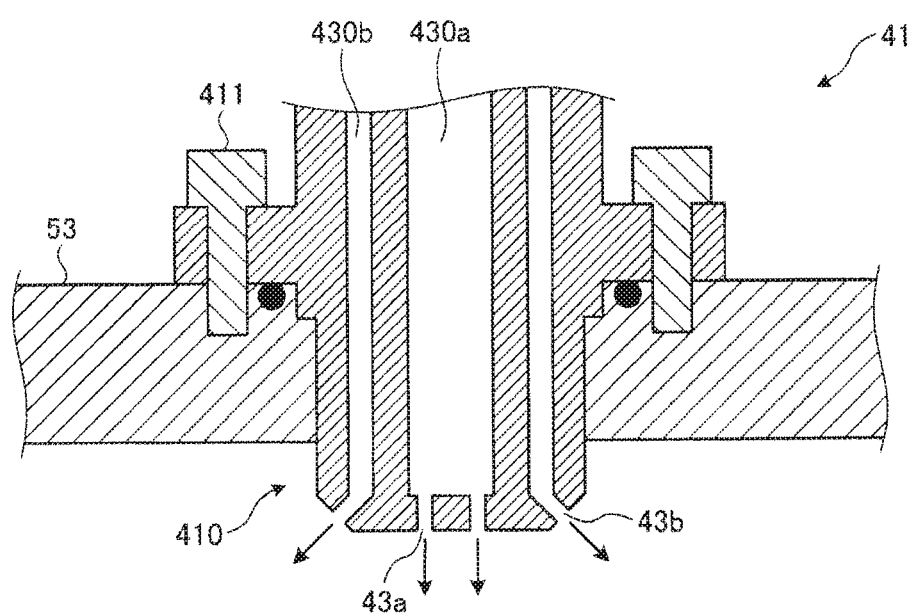
FIG. 13 shows another example of the structure of the gas injection unit.

In the above-described first embodiment, each of the injection ports 43*b* injects the processing gas in a horizontal direction as shown in FIG. 7, for example. However, the present disclosure is not limited thereto. As shown in FIG. 13, for example, each of the injection ports 43*b* may be configured to inject the processing gas in a direction away from the Z-axis, i.e., in an obliquely downward direction. FIG. 13 shows another example of the structure of the gas injection unit 41.

Second Embodiment

In the first embodiment, the occurrence of abnormal discharge in the gas injection unit 41 was suppressed by providing the inner coil 542 inside the outer coil 541. On the other hand, in the second embodiment, the occurrence of abnormal discharge in the gas injection unit 41 is suppressed by providing a shielding member around a space in the gas injection unit 41 where the processing gas flows.

(Structure of the Gas Injection Unit 41)

Figure 14:
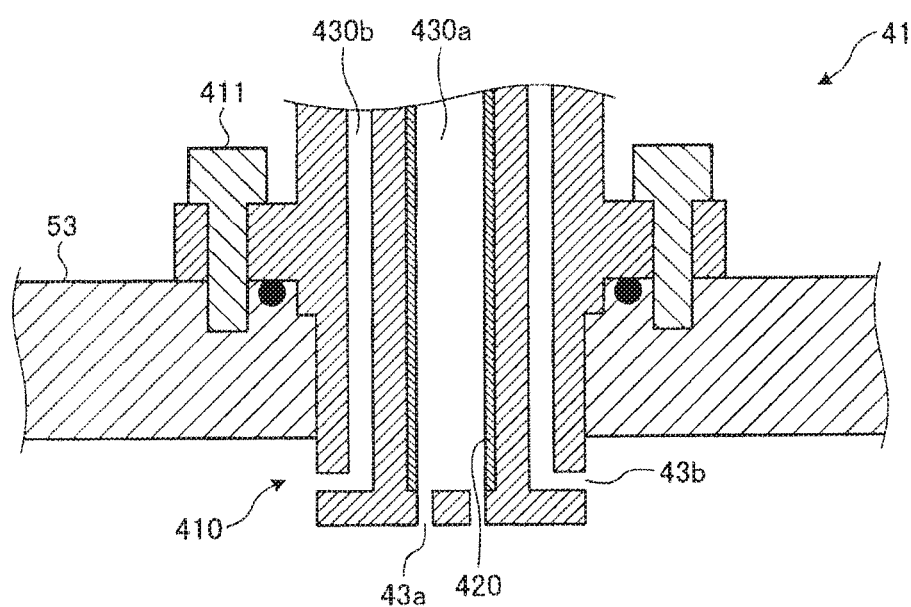
FIG. 14 shows an example of a structure of a gas injection unit in a second embodiment.

FIG. 14 shows an example of the structure of the gas injection unit 41 in the second embodiment. Among the components shown in FIG. 14, the components denoted by like reference numerals as those of the components shown in FIG. 7 have the same functions as those described with reference to FIG. 7, except for the following features. Therefore, detailed description thereof will be omitted.

In the gas injection unit 41 of the present embodiment, as shown in FIG. 14, for example, a plate-shaped shielding member 420 is provided at a sidewall forming the space 430*a* in the gas injection unit 41. The shielding member 420 is made of a non-magnetic conductive metal such as titanium or the like. A lower end of the shielding member 420 extends downward from the lower surface of the dielectric window 53. For example, the shielding member 420 is a metal film formed by thermally spraying titanium or the like on the sidewall forming the space 430*a* in the gas injection unit 41. Since the space 430*a* in the gas injection unit 41 is substantially cylindrical, the shielding member 420 is formed in a cylindrical shape.

By providing the shielding member 420 at the sidewall forming the space 430*a* in the gas injection unit 41, the electromagnetic wave generated from the antenna 54 is prevented from entering the space 430*a*. Accordingly, the occurrence of abnormal discharge in the space 430*a* is suppressed. In the example shown in FIG. 14, the shielding member 420 is provided at the sidewall forming the space 430. However, the shielding member 420 may also be provided at a sidewall of each space 430*b*.

Figure 15:
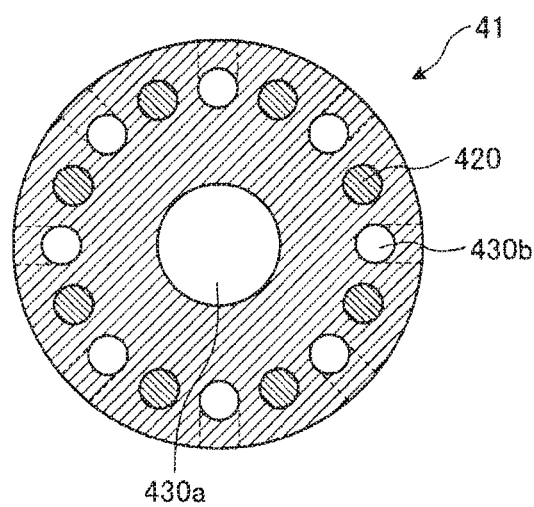
FIG. 15 shows an example of arrangement of rod-shaped shielding members.

In the example shown in FIG. 14, the plate-shaped shielding member 420 is provided at the sidewall forming the space 430*a*. However, in another example, a plurality of rod-shaped shielding members 420 may be provided around the space 430*a*. FIG. 15 shows an example of the arrangement of the rod-shaped shielding members 420. FIG. 15 is a cross sectional view of the gas injection unit 41 when viewed from the Z-axis direction. In the example shown in FIG. 15, eight rod-shaped shielding members 420 are interposed between adjacent spaces 430*b*. However, eight or more shielding members 420 may be arranged around the space 430*a*. When eight or more shielding members 420 are arranged around the space 430*a*, the shielding members 420 may be provided in the sidewall outer than the space 430*b* instead of being interposed between the adjacent spaces 430*b*. Accordingly, the occurrence of abnormal discharge in the space 430*b* can also be suppressed.

FIG. 16 shows examples of an electric field reduction rate of the gas injection unit 41 by the shielding member 420. FIG. 16 shows the results of the simulation on the electric field reduction ratio in the case of providing different shielding members 420 with respect to an electric field intensity applied to a region of the lower part 410 of the gas injection unit 41 which includes the space 430*a* and the space 430*b* in the case of not providing the shielding member 420. Further, in FIG. 16, a high frequency power of 60 MHz and 1 kW is supplied to an inner resonator used instead of the inner coil 542, and the inner resonator resonates at a wavelength that is a half of that of the high frequency power. An upper portion, an intermediate portion, and a lower portion shown in FIG. 16 represent an upper portion, an intermediate portion, and a lower portion of the region of the lower part 410 of the gas injection unit 41, respectively. In FIG. 16, the simulation was conducted while setting a thickness of the cylindrical shielding member 420 (cylindrical shield) shown in FIG. 14, for example, to 0.5 mm, and a diameter of the rod-shaped shielding member 420 (rod-shaped shield) shown in FIG. 15, for example, to 2 mm.

As shown in FIG. 16, for example, in any type of the shield members 420, the electric field intensity applied to the region of the lower part 410 of the gas injection unit 41 was reduced and the shielding effect was realized. The shielding effect of the cylindrical shield is higher than that of the rod-shaped shield. The shielding effect is improved as the number of rod-shaped shields is increased, i.e., as a gap between the rod-shaped shields is reduced.

FIGS. 17A to 17C show examples of test results obtained by examining whether or not discharge has occurred in the second embodiment. FIG. 17A shows the test result obtained when the pressure in the chamber 11 is 10 mT. FIG. 17B shows the test result obtained when the pressure in the chamber 11 is 100 mT. FIG. 17C shows the test result obtained when the pressure in the chamber 11 is 400 mT. In the tests shown in FIGS. 17A to 17C, the gas injection unit 41 having the structure shown in FIG. 14 was used, and the inner resonator was used instead of the inner coil 542. The high frequency power was not applied to the outer coil 541.

The test results shown in FIGS. 17A to 17C were obtained mainly under the following conditions.

Pressure in the chamber 11: 10 to 400 mT
Processing gas: Ar=100 to 1500 sccm
High frequency power supplied to the inner resonator: 100 to 650 W
Frequency of the high frequency power supplied to the inner resonator: 60 MHz As shown in FIGS. 17A to 17C, for example, even when the inner resonator is provided near the gas injection unit 41, in the gas injection unit 41 of the second embodiment which has therein the shielding member 420, the occurrence of abnormal discharge was considerably suppressed, compared to the test result (see FIGS. 8A to 8C) obtained in the gas injection unit 41 having no shielding member 420. By providing the shielding member 420 around the space in the gas injection unit 41 where the processing gas flows, even when the inner resonator is provided near the gas injection unit 41, the occurrence of abnormal discharge in the gas injection unit 41 can be suppressed. In addition, by replacing the inner coil 542 with the inner resonator, the occurrence of abnormal discharge in the gas injection unit 41 can be further suppressed.

Figure 18:
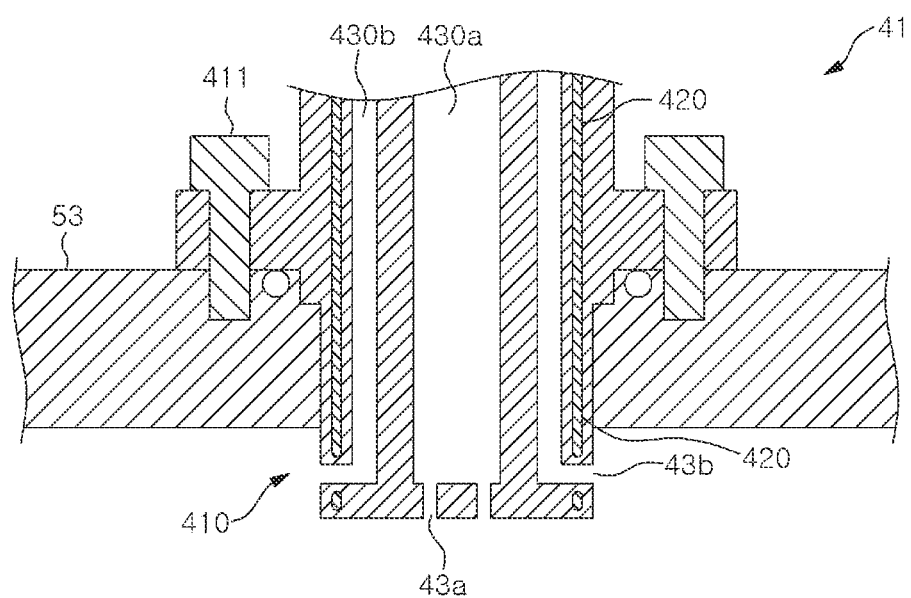
FIG. 18 shows another example of the arrangement of the shielding member.
Figure 19:
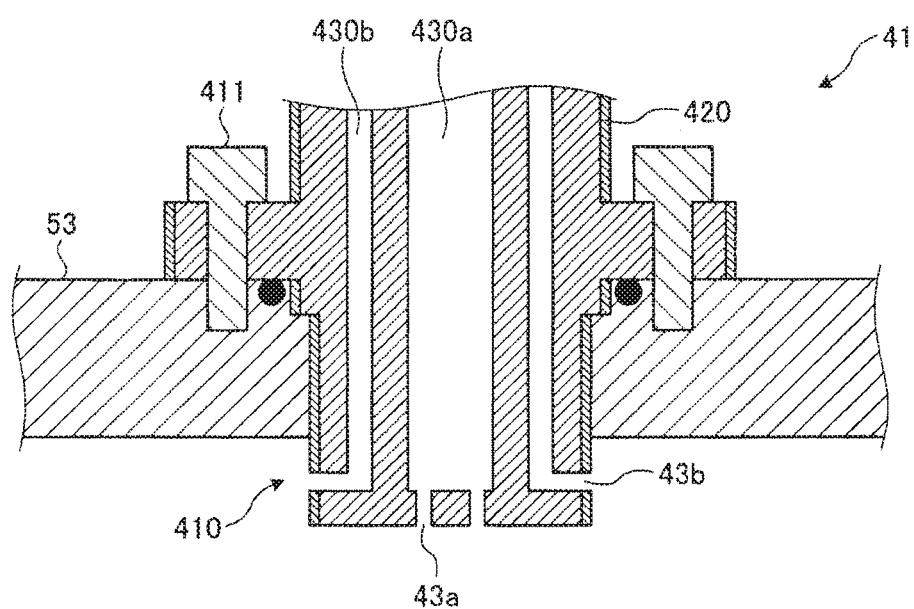
FIG. 19 shows still another example of the arrangement of the shielding member.

In the second embodiment, the plate-shaped shielding member 420 (see FIG. 14) and the rod-shaped shielding members 420 (see FIG. 15) are provided around the space 430*a*. However, the arrangement of the shielding members 420 is not limited. As shown in FIG. 18, for example, the plate-shaped shielding member 420 may be buried in the sidewall of the gas injection unit 41 to surround the spaces 430*a* and 430*b*. Besides, as shown in FIG. 19, for example, the shielding member 420 may be provided at the outer wall of the gas injection unit 41. For example, after a metal film of the shielding member 420 is formed by thermally spraying a metal forming the shielding member 420 on the sidewall of the gas injection unit 41, ceramic or the like may be further sprayed on the surface of the shielding member 420.

Third Embodiment

If the space in the gas injection unit 41 where the processing gas flows is linearly extended in the Z-axis direction, electrons are likely to be accelerated in the Z-axis direction and abnormal discharge is likely to occur in the space in the gas injection unit 41. Therefore, in the third embodiment, the space in the gas injection unit 41 is formed such that a length of the space extended linearly in the Z-axis direction becomes short.

Figure 20:
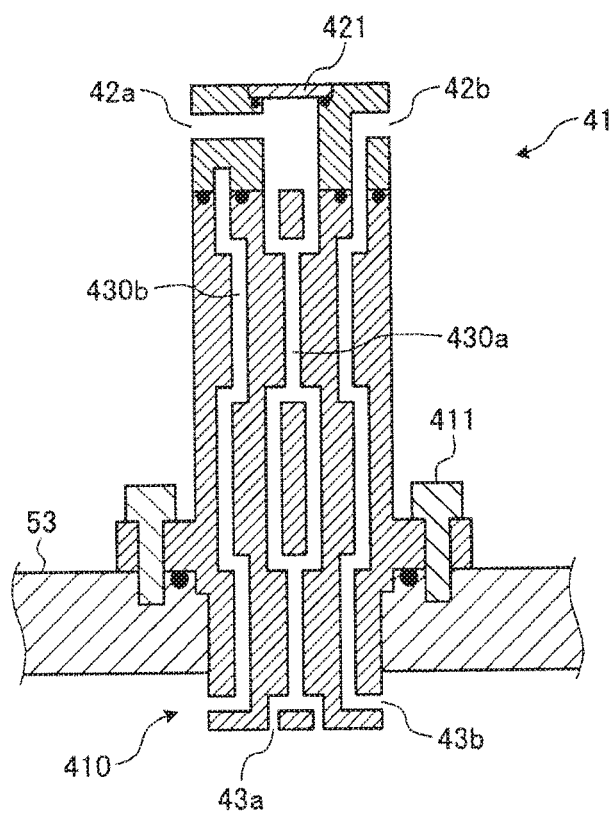
FIG. 20 shows an example of a structure of a gas injection unit in a third embodiment.

FIG. 20 shows an example of the structure of the gas injection unit 41 in the third embodiment. Among the components shown in FIG. 20, the components denoted by like reference numerals as those of the components shown in FIG. 7 have the same functions as those described with reference to FIG. 7, except for the following features. Therefore, detailed description thereof will be omitted.

As shown in FIG. 20, for example, at least a part of the space 430*a* where the gas injected from the injection ports 43*a* flows is bent to prevent formation of a linear path extending from the injection ports 43*a* to the upper end of the gas injection unit 41. Similarly, at least a part of the space 430*b* where the gas injected from the injection ports 43*b* flows is bent to prevent formation of a linear path extending from the injection ports 43*b* to the upper end of the gas injection unit 41. The spaces 430*a* and 430*b* have a so-called labyrinth structure.

FIGS. 21A to 21C show examples of test results obtained by examining whether or not discharge has occurred in the third embodiment. FIG. 21A shows the test result obtained when the pressure in the chamber 11 is 10 mT. FIG. 21B shows the test result obtained when the pressure in the chamber 11 is 100 mT. FIG. 21C shows the test result obtained when the pressure in the chamber 11 is 400 mT. In the test shown in FIGS. 21A to 21C, the gas injection unit 41 having the structure shown in FIG. 20 was used, and the inner resonator was used instead of the inner coil 542. The high frequency power was not applied to the outer coil 541.

The test results shown in FIGS. 21A to 21C were obtained mainly under the following conditions.

Pressure in the chamber 11: 10 to 400 mT
Processing gas: Ar=100 to 1500 sccm
High frequency power supplied to the inner resonator: 100 to 650 W
Frequency of the high frequency power supplied to the inner resonator: 60 MHz As shown in FIGS. 21A to 21C, for example, even when the inner resonator is provided near the gas injection unit 41, in the gas injection unit 41 of the present embodiment in which the space in the gas injection unit 41 has a labyrinth structure, the occurrence of abnormal discharge was considerably suppressed, compared to the test result (see FIGS. 8A to 8C) obtained in the gas injection unit 41 (see FIG. 7) in which the space in the gas injection unit 41 does not have a labyrinth structure. By allowing the space in the gas injection unit 41 where the processing gas flows to have a labyrinth structure, even when the inner resonator is provided near the gas injection unit 41, the occurrence of abnormal discharge in the gas injection unit 41 can be suppressed. In addition, by replacing the inner coil 542 with the inner resonator, the occurrence of abnormal discharge in the gas injection unit 41 can be further suppressed.

Figure 22:
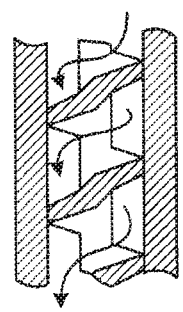
FIG. 22 shows another example of a structure of a gas flow path.

The spaces 430*a* and 430*b* in the gas injection unit 41 where the processing gas flows may be formed such that a spiral-shaped gas flow path can be formed from the injection ports 43*a* and 43*b* to the upper end of the gas injection unit 41 as can be seen from FIG. 22, for example.

(Other Applications)

The present disclosure is not limited to the above-described embodiments, and various modifications can be made within the scope of the gist of the present disclosure.

In the above-described embodiments, the processing gas is supplied into the chamber 11 from the gas injection unit provided substantially at the central portion of the dielectric window 53. However, a plurality of injection ports for injecting the processing gas toward the Z-axis may be provided in the circumferential direction along the sidewall of the chamber 11, in addition to the gas injection unit 41.

In each of the second and third embodiment, each of the injection ports 43*b* may be configured to inject the processing gas in a direction away from the Z-axis, i.e., in an obliquely downward direction, as shown in FIG. 13, for example.

While the present disclosure has been shown and described with respect to the embodiments, it will be understood by those skilled in the art that various changes and modifications may be made without departing from the scope of the present disclosure as defined in the following claims.

What is claimed is:

1. A plasma processing apparatus comprising:
a chamber configured to accommodate a target substrate;
a dielectric window forming an upper portion of the chamber;
a gas supplier configured to supply a processing gas from an upper portion of the chamber into the chamber;
an antenna provided above the chamber to surround the gas supplier and configured to generate plasma of the processing gas in the chamber by supplying a high frequency power into the chamber; and
a power supplier configured to supply a high frequency power to the antenna,
wherein the antenna includes:
an inner coil provided around the gas supplier to surround the gas supplier; and
an outer coil formed from a wire having first and second ends provided at an outer side of the inner coil such that the outer coil is provided around the gas supplier and the inner coil to surround the gas supplier and the inner coil, the first end provided closer to the inner coil than the second end, the outer coil having a first radius, from a central axis of the gas supplier to the first end, that is larger than a second radius from the central axis to the inner coil,
wherein the outer coil is configured such that the first and second ends of the wire forming the outer coil are opened, power is supplied from the power supplier to a central point along the wire, the wire is grounded near the central point and the outer coil resonates at a wavelength that is a half of a wavelength of the high frequency power supplied from the power supplier, and
the inner coil is configured such that both ends of a wire forming the inner coil are connected through a capacitor and the inner coil is inductively coupled with the outer coil.

2. The plasma processing apparatus of claim 1, wherein the outer coil is wound two or more turns in a substantially circular spiral shape,
the inner coil is formed in a substantially circular ring shape, and
the outer coil and the inner coil are arranged such that an outer shape of the outer coil and an outer shape of the inner coil form concentric circles.

3. The plasma processing apparatus of claim 2, wherein the gas supplier has a substantially cylindrical shape, and the outer coil and the inner coil are arranged such that a center of the outer shape of the outer coil and a center of the outer shape of the inner coil are positioned on the central axis of the gas supplier.

4. The plasma processing apparatus of claim 1, wherein the outer coil and the inner coil are arranged inside the dielectric window or above the dielectric window, and a distance between a plane including the outer coil and a lower surface of the dielectric window is different from a distance between a plane including the inner coil and the lower surface of the dielectric window.

5. The plasma processing apparatus of claim 4, wherein the distance between the plane including the inner coil and the lower surface of the dielectric window is shorter than the distance between the plane including the outer coil and the lower surface of the dielectric window.

6. The plasma processing apparatus of claim 1, wherein the power supplier allows a frequency of the high frequency power supplied to the antenna to be variable.

7. The plasma processing apparatus of claim 1, wherein the capacitor provided at the inner coil is a variable capacitance capacitor.

8. The plasma processing apparatus of claim 1, wherein a flow path through which the processing gas supplied to the chamber flows is formed in the gas supplier, and
a pressure in the flow path is higher than a pressure in the chamber.

9. The plasma processing apparatus of claim 1, wherein the gas supplier includes:
a protruding part that is a lower part of the gas supplier and protrudes into the chamber from the lower surface of the dielectric window;
a first injection port provided at the protruding part and configured to inject the processing gas in a downward direction, and
a second injection port provided at the protruding part and configured to inject the processing gas in a horizontal direction or in an obliquely downward direction.

10. The plasma processing apparatus of claim 9, wherein a conductive shielding member is provided at the gas supplier to surround a space through which the processing gas passes.

11. The plasma processing apparatus of claim 10, wherein a lower end of the shielding member is positioned below the lower surface of the dielectric window.

12. The plasma processing apparatus of claim 10, wherein the shielding member is formed in a plate shape.

13. The plasma processing apparatus of claim 10, wherein the shielding member is a metal film formed on an outer wall of the gas supplier or a sidewall of a space in the gas supplier through which the processing gas flows.

14. The plasma processing apparatus of claim 10, wherein the shielding member is formed in a rod shape.

15. The plasma processing apparatus of claim 9, wherein at least a part of the space in the gas supplier through which the processing gas flows is bent to prevent formation of a linear path extending from the first injection port and the second injection port to an upper end of the gas supplier.

* * * * *